(12) United States Patent
Watanabe et al.

(10) Patent No.: US 8,482,646 B2
(45) Date of Patent: Jul. 9, 2013

(54) IMAGE SENSING DEVICE AND CAMERA (75) Inventors: Takanori Watanabe, Yamato (JP); Mineo Shimotsusa, Machida (JP); Takeshi Ichikawa, Hachioji (JP); Hajime Ikeda, Yokohama (JP); Yasuhiro Sekine, Yokohama (JP); Akira Ohtani, Ebina (JP); Takeshi Kojima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 13/139,558

(22) PCT Filed: Jan. 20, 2010

(86) PCT No.: PCT/JP2010/050998
§ 371 (c)(1),
(2), (4) Date: Jun. 14, 2011

(87) PCT Pub. No.: WO2010/090104
PCT Pub. Date: Aug. 12, 2010

(65) Prior Publication Data
US 2011/0242388 A1    Oct. 6, 2011

(30) Foreign Application Priority Data

Feb. 6, 2009    (JP) .................................. 2009-026699
Dec. 24, 2009   (JP) .................................. 2009-293211

(51) Int. Cl.
| | |
|---|---|
| H04N 3/14 | (2006.01) |
| H04N 5/335 | (2006.01) |
| C12Q 1/68 | (2006.01) |
| H01J 40/00 | (2006.01) |
| H01L 29/04 | (2006.01) |
| H01L 29/10 | (2006.01) |
| H01L 31/00 | (2006.01) |

(52) U.S. Cl.
USPC ........... 348/308; 348/302; 348/310; 250/200; 257/53

(58) Field of Classification Search
USPC .............. 250/200–239; 257/53; 348/300–310
See application file for complete search history.

(56) References Cited

U.S. PATENT DOCUMENTS

| | | | |
|---|---|---|---|
| 4,549,914 A | 10/1985 | Oh | 148/187 |
| 5,466,961 A | 11/1995 | Kikuchi et al. | 257/379 |

(Continued)

FOREIGN PATENT DOCUMENTS

| | | |
|---|---|---|
| EP | 1 505 655 A2 | 2/2005 |
| EP | 1 858 082 A1 | 11/2007 |

(Continued)

OTHER PUBLICATIONS

Office Action issued Dec. 20, 2012, in counterpart Chinese Patent Application No. 201080006236.6, with translation.

*Primary Examiner* — Lin Ye
*Assistant Examiner* — Chia-Wei A Chen
(74) *Attorney, Agent, or Firm* — Fitzpatrick, Cella, Harper & Scinto (57) ABSTRACT

An image sensing device comprises a pixel array, and a peripheral circuit, a column selecting circuit, and a readout, wherein each pixel includes a photodiode, a floating diffusion, a transfer PMOS transistor to the floating diffusion, an amplifier PMOS transistor, and a reset PMOS transistor, the amplifier PMOS transistor has a gate which is formed by an n-type conductive pattern, and is isolated by a first element isolation region and an n-type impurity region which covers at least a lower portion of the first element isolation region, and each PMOS transistor included in the column selecting circuit has a gate which is formed by a p-type conductive pattern and is isolated by a second element isolation region, and an n-type impurity concentration in a region adjacent to a lower portion of the second element isolation region is lower than that in the n-type impurity region.

9 Claims, 9 Drawing Sheets

U.S. PATENT DOCUMENTS

| | | | | |
|---|---|---|---|---|
| 5,602,413 | A | 2/1997 | Morishita | 257/438 |
| 5,614,744 | A * | 3/1997 | Merrill | 257/291 |
| 5,693,959 | A | 12/1997 | Inoue et al. | 257/55 |
| 5,864,163 | A | 1/1999 | Chou et al. | 257/385 |
| 6,171,895 | B1 | 1/2001 | Chou et al. | 438/217 |
| 6,188,106 | B1 | 2/2001 | Gardner et al. | 257/339 |
| 6,207,981 | B1 | 3/2001 | Hatano et al. | 257/221 |
| 6,429,471 | B1 | 8/2002 | Yokoyama et al. | 257/289 |
| 6,465,768 | B1 * | 10/2002 | Ker et al. | 250/214.1 |
| 6,482,719 | B1 | 11/2002 | Anjum et al. | 438/449 |
| 6,974,737 | B2 * | 12/2005 | Snyder et al. | 438/199 |
| 7,037,371 | B1 | 5/2006 | Hashimoto et al. | 117/108 |
| 7,229,878 | B2 | 6/2007 | Jeon | 438/246 |
| 7,323,731 | B2 | 1/2008 | Yuzurihara et al. | 257/292 |
| 7,540,198 | B2 | 6/2009 | Ichikawa | 73/754 |
| 7,592,579 | B2 * | 9/2009 | Tamura et al. | 250/208.1 |
| 7,598,136 | B2 * | 10/2009 | Park et al. | 438/201 |
| 7,625,774 | B2 * | 12/2009 | Lee | 438/60 |
| 7,638,352 | B2 | 12/2009 | Sawayama et al. | 438/57 |
| 7,728,277 | B2 * | 6/2010 | Stevens et al. | 250/214.1 |
| 7,737,519 | B2 * | 6/2010 | Tamura et al. | 257/446 |
| 7,838,956 | B2 * | 11/2010 | McCarten et al. | 257/447 |
| 8,106,984 | B2 | 1/2012 | Takeuchi et al. | 348/308 |
| 2001/0055832 | A1 * | 12/2001 | Schmitz et al. | 438/57 |
| 2003/0034496 | A1 | 2/2003 | Yoneta et al. | 257/79 |
| 2003/0071686 | A1 | 4/2003 | Lemkin | 330/253 |
| 2003/0235936 | A1 * | 12/2003 | Snyder et al. | 438/92 |
| 2004/0097018 | A1 | 5/2004 | Lee et al. | 438/128 |
| 2005/0116259 | A1 | 6/2005 | Komori | 257/222 |
| 2005/0173772 | A1 | 8/2005 | Kim et al. | 257/431 |
| 2005/0265515 | A1 | 12/2005 | Tashiro et al. | 378/20 |
| 2006/0076581 | A1 | 4/2006 | Oda et al. | 257/215 |
| 2006/0081957 | A1 | 4/2006 | Itonaga et al. | 257/444 |
| 2006/0131624 | A1 | 6/2006 | Katsuno et al. | 257/292 |
| 2006/0157837 | A1 | 7/2006 | Nagase | 257/678 |
| 2006/0175538 | A1 | 8/2006 | Kim et al. | 250/208.1 |
| 2006/0244020 | A1 | 11/2006 | Lee | 257/291 |
| 2007/0023796 | A1 | 2/2007 | Adkisson et al. | 257/290 |
| 2007/0108371 | A1 | 5/2007 | Stevens et al. | 250/214.1 |
| 2007/0141801 | A1 | 6/2007 | Kwon et al. | 438/400 |
| 2007/0148808 | A1 * | 6/2007 | Lee | 438/69 |
| 2007/0148929 | A1 * | 6/2007 | Lee | 438/527 |
| 2007/0161142 | A1 * | 7/2007 | Mouli et al. | 438/57 |
| 2007/0200181 | A1 * | 8/2007 | Rhodes | 257/384 |
| 2007/0263105 | A1 | 11/2007 | Kano et al. | 348/241 |
| 2008/0006892 | A1 | 1/2008 | Ura et al. | 257/431 |
| 2008/0035963 | A1 | 2/2008 | Kwon et al. | 258/291 |
| 2008/0036019 | A1 * | 2/2008 | Tamura et al. | 257/431 |
| 2008/0057615 | A1 | 3/2008 | Okagawa et al. | 438/73 |
| 2008/0165577 | A1 * | 7/2008 | Fazan et al. | 365/174 |
| 2008/0224146 | A1 | 9/2008 | Ichikawa | 257/72 |
| 2008/0258134 | A1 | 10/2008 | Mears et al. | 257/15 |
| 2009/0021626 | A1 | 1/2009 | Mori et al. | 348/308 |
| 2009/0042331 | A1 * | 2/2009 | Dosluoglu et al. | 438/59 |
| 2009/0067702 | A1 * | 3/2009 | Mauritzson | 382/145 |
| 2009/0166516 | A1 * | 7/2009 | Tamura et al. | 250/214.1 |
| 2009/0201400 | A1 | 8/2009 | Zhang et al. | 348/296 |
| 2009/0224299 | A1 * | 9/2009 | Mouli et al. | 257/292 |
| 2009/0237543 | A1 | 9/2009 | Hatano et al. | 348/308 |
| 2009/0289286 | A1 | 11/2009 | Kim | 257/292 |
| 2009/0295973 | A1 * | 12/2009 | Oshikubo et al. | 348/311 |
| 2010/0148289 | A1 * | 6/2010 | McCarten et al. | 257/432 |
| 2010/0188545 | A1 * | 7/2010 | Stevens et al. | 348/308 |
| 2010/0201859 | A1 * | 8/2010 | Mouli et al. | 348/308 |
| 2010/0203667 | A1 | 8/2010 | Hirota et al. | 438/72 |
| 2010/0203670 | A1 | 8/2010 | Ohtani et al. | 438/98 |
| 2010/0308385 | A1 | 12/2010 | Manda et al. | 257/292 |
| 2011/0122307 | A1 * | 5/2011 | Parks | 348/308 |
| 2011/0127408 | A1 | 6/2011 | Yanagita et al. | 250/208.1 |
| 2011/0157447 | A1 | 6/2011 | Watanabe et al. | 348/308 |
| 2011/0240835 | A1 | 10/2011 | Sawayama et al. | 250/214.1 |
| 2011/0249163 | A1 | 10/2011 | Ikeda et al. | 348/308 |
| 2011/0281319 | A1 | 11/2011 | Swayze et al. | 435/173.9 |
| 2012/0188428 | A1 * | 7/2012 | Tanaka | 348/300 |

FOREIGN PATENT DOCUMENTS

| | | |
|---|---|---|
| JP | 2006-120679 A | 5/2006 |
| JP | 2007-073544 A | 3/2007 |
| JP | 2008-085304 A | 4/2008 |
| JP | 2008-153566 A | 7/2008 |
| WO | WO 2005/096384 A1 | 10/2005 |

* cited by examiner

IMAGE SENSING DEVICE AND CAMERA

TECHNICAL FIELD

The present invention relates to an image sensing device and a camera.

BACKGROUND ART

As disclosed in Japanese Patent Laid-Open No. 2006-120679, 1/f noise is reduced when the gate of an amplifier transistor included in each pixel of a MOS image sensor is formed to have a buried channel structure. As disclosed in the paragraph "0034" of Japanese Patent Laid-Open No. 2006-120679, as a method of forming the buried channel structure, when the amplifier transistor is a MOS transistor of a first conductivity type, its gate electrode is formed by polysilicon of a second conductivity type. As disclosed in the paragraph "0062" of Japanese Patent Laid-Open No. 2006-120679, a PMOS transistor can be used as the amplifier transistor in place of an NMOS transistor.

Japanese Patent Laid-Open No. 2006-120679 has not examined about channel structures of transistors in a peripheral region as a region other than a pixel region. If that reference pursuits process simplification, all MOS transistors of an identical conductivity type (for example, PMOS transistors) in a pixel region and peripheral region should have an identical channel structure. In this case, all MOS transistors of the same conductivity type as that of the amplifier transistor in the pixel region may have a buried channel structure.

However, a MOS transistor having a buried channel structure (for example, a PMOS transistor having an n-type gate) tends to be a normally ON transistor. For this reason, a leak current may increase, and consumption power may become high.

Also, Japanese Patent Laid-Open No. 2006-120679 has not examined about a structure of a channel stopper region in a MOS transistor. Since the amplifier transistor of each pixel is arranged adjacent to a photodiode, it should be isolated by an element isolation structure including a channel stop region so as to suppress the influence of a dark current. On the other hand, since a column selecting circuit requires a miniaturized transistor structure more than transistors which form each pixel, it is important to reduce an ON resistance of the transistor, but necessity of consideration of a dark current is low. The channel stop region arranged in the column selecting circuit not only increases an ON resistance but also disturbs miniaturization, resulting in disadvantages rather than advantages. When a portion that especially requires a high-seed operation in a peripheral circuit (in particular, a MOS transistor of the column selecting circuit (also called a column decoder or horizontal scanning circuit)) uses the same structure as the amplifier MOS transistor of each pixel, an image sensing device having a sufficiently high readout speed cannot be obtained.

DISCLOSURE OF INVENTION

The present invention has been made because of recognition of the aforementioned subjects, and attains, for example, both a reduction of 1/f noise in each pixel and a high readout speed of a signal in an image sensing device.

One of the aspects of the present invention provides an image sensing device comprising a pixel array in which pixels are arranged to form a plurality of rows and a plurality of columns, and a peripheral circuit including a row selecting circuit which selects a row in the pixel array, a column selecting circuit which selects a column in the pixel array, and a readout circuit which reads out a signal of the column selected by the column selecting circuit in the pixel array, wherein each pixel includes a photodiode, a floating diffusion, a transfer PMOS transistor which transfers a hole stored in a storage region of the photodiode to the floating diffusion, an amplifier PMOS transistor which amplifies a signal that appears in the floating diffusion, and a reset PMOS transistor which resets a potential of the floating diffusion, the amplifier PMOS transistor has a gate which is formed by an n-type conductive pattern, and is isolated by a first element isolation region and an n-type impurity region which covers at least a lower portion of the first element isolation region, and each PMOS transistor included in the column selecting circuit has a gate which is formed by a p-type conductive pattern and is isolated by a second element isolation region, and an n-type impurity concentration in a region adjacent to a lower portion of the second element isolation region is lower than an n-type impurity concentration in the n-type impurity region.

Further features of the present invention will become apparent from the following description of exemplary embodiments with reference to the attached drawings.

BEST MODE FOR CARRYING OUT THE INVENTION

Embodiments of the present invention will be described hereinafter with reference to the accompanying drawings.

Figure 1:
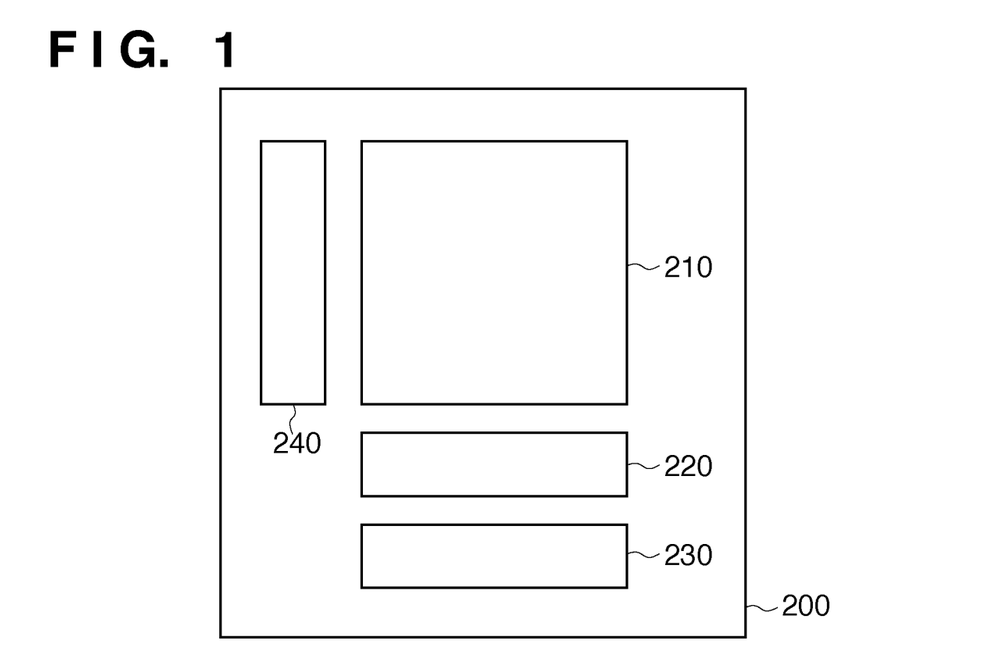
FIG. 1 is a schematic view showing the arrangement of an image sensing device according to an embodiment of the present invention.

FIG. 1 is a schematic view showing the arrangement of an image sensing device 200 according to an embodiment of the present invention. The image sensing device 200 is formed on a semiconductor substrate, and can be called, for example, a solid-state image sensor, MOS image sensor, CMOS sensor, or the like.

The image sensing device 200 according to the embodiment of the present invention includes a pixel array 210 in which pixels are two-dimensionally arranged to form a plurality of rows and a plurality of columns. The image sensing device 200 can also include a row selecting circuit 240 which selects a row in the pixel array 210, a column selecting circuit 230 which selects a column in the pixel array 210, and a readout circuit 220 which reads out a signal of the column selected by the column selecting circuit 230 in the pixel array 210. The row selecting circuit 240 and column selecting circuit 230 can include, for example, shift registers, but they may also be configured to randomly access rows and columns.

Figure 2:
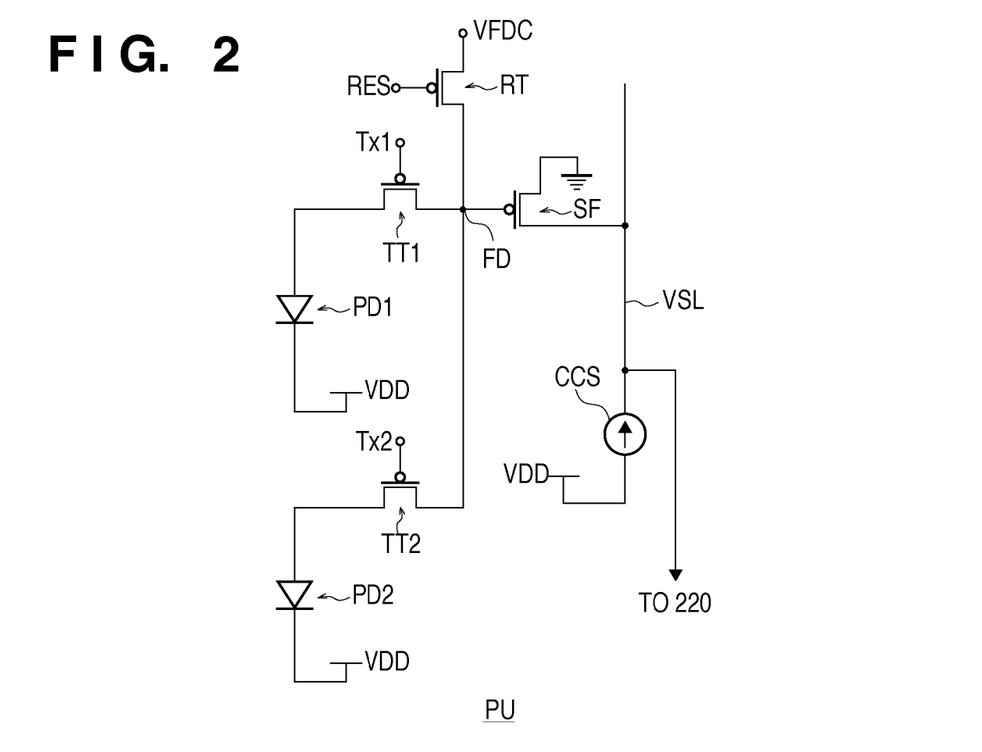
FIG. 2 is a circuit diagram showing an example of the arrangement of a pixel unit of a pixel array.

FIG. 2 is a circuit diagram showing an example of the arrangement of a pixel unit PU in the pixel array 210. In this arrangement example, the pixel unit PU includes two pixels. However, the pixel unit PU may form a single pixel or may include three or more pixels as other embodiments. The pixel unit PU is configured to read out a hole of an electron and hole generated by photoelectric conversion as a signal. The pixel array 210 is formed by two-dimensionally laying out pixel units PU each including at least one pixel.

In the arrangement example shown in FIG. 2, the pixel unit PU can include two photodiodes PD1 and PD2 serving as photoelectric conversion units, two transfer transistors TT1 and TT2, one amplifier transistor SF, and one reset transistor RT. The amplifier transistor SF and reset transistor RT are shared by the photodiodes PD1 and PD2 and the transfer transistors TT1 and TT2. Each of the transfer transistor TT (TT1, TT2), amplifier transistor SF, and reset transistor RT is formed as a PMOS transistor. The amplifier transistor SF can be called an amplifier PMOS transistor. The transfer transistor TT can be called a transfer PMOS transistor. The reset transistor RT can be called a reset PMOS transistor.

The transfer transistors TT1 and TT2 are enabled when an active pulse (low pulse) is applied to transfer signal lines Tx1 and Tx2 connected to their gates. Then, holes stored in storage regions (p-type regions) of the photodiodes PD1 and PD2 are transferred to a floating diffusion FD. Note that the photodiodes PD1 and PD2 are arranged to form different rows, and an active pulse is applied to the transfer signal lines Tx1 and Tx2 at different timings.

The amplifier transistor SF forms a source-follower circuit together with a constant current source CCS which supplies a constant current to a vertical signal line (column signal line) VSL. The amplifier transistor SF amplifies, by a source-follower operation, a signal (potential change) which appears in the floating diffusion FD as a result of transfer of a hole to the floating diffusion FD via the transfer transistor TT, and outputs the amplified signal onto the vertical signal line VSL. The signal output onto the vertical signal line VSL is read out by the readout circuit 220. The reset transistor RT is enabled to reset the floating diffusion FD when an active pulse (low pulse) is applied to a reset signal line RES connected to its gate.

In the arrangement example shown in FIG. 2, a row is selected by controlling a potential VFDC applied to the drain electrode of the reset transistor RT. A row in which the potential of the floating diffusion FD is reset to a potential that does not enable the amplifier transistor SF is set in a non-selecting state. On the other hand, a row in which the potential of the floating diffusion FD is reset to a potential that enables the amplifier transistor SF is set in a selecting state. As another embodiment, a selecting transistor used to select a row may be arranged in series with the amplifier transistor SF between the ground potential and the vertical signal line VSL. The selecting transistor may be arranged, for example, between the ground potential and the amplifier transistor SF or between the amplifier transistor SF and the vertical signal line VSL.

Figure 3:
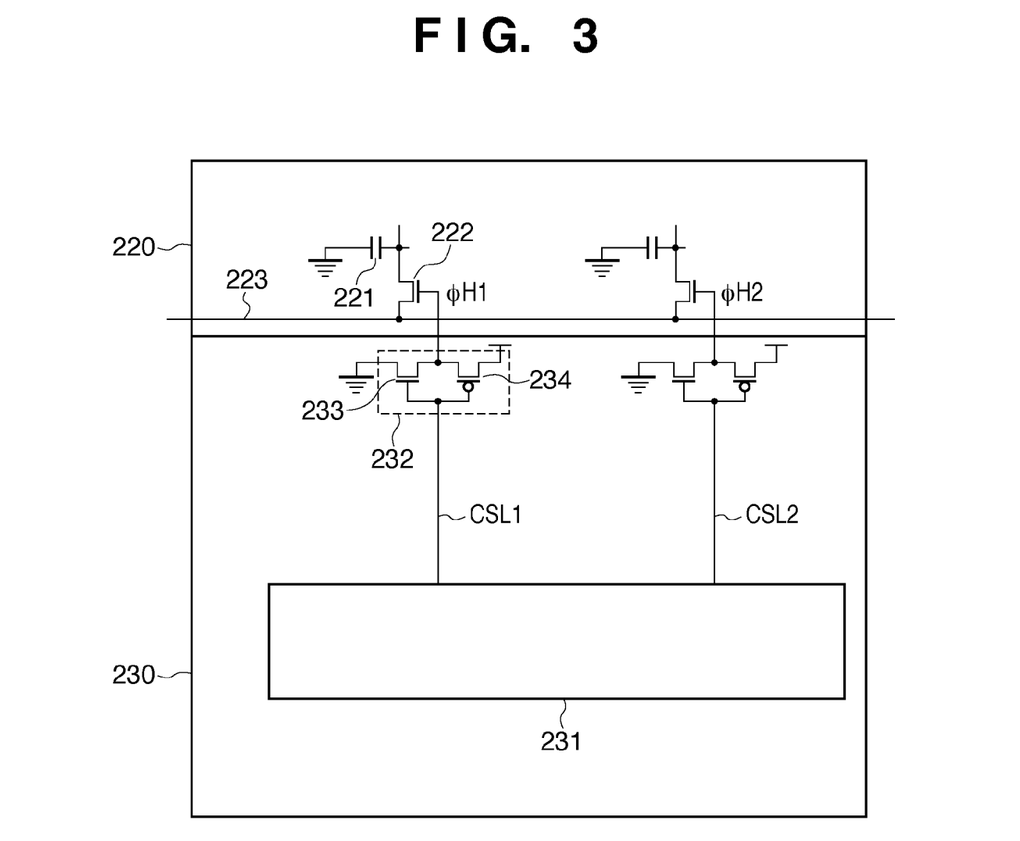
FIG. 3 is a circuit diagram showing an example of the arrangement of a portion of a readout circuit and that of a column selecting circuit.

FIG. 3 is a circuit diagram showing an example of the arrangement of a portion of the readout circuit 220 and that of the column selecting circuit 230. The readout circuit 220 can have a capacitor 221 and switch 222 for each column, that is, for each vertical signal line (column signal line) VSL. The capacitor 221 holds a signal output onto the vertical signal line (column signal line) VSL of the pixel array 210 or a signal obtained by amplifying that signal by an amplifier (not shown). The switch 222 includes, for example, a MOS transistor. When the switch 222 is selected by the column selecting circuit 230 (i.e., when a signal ϕH1 (ϕH2, ... ) of active level is applied to its gate), the switch 222 is enabled to output a signal held by the capacitor 221 onto a horizontal signal line 223. The signal output onto the horizontal signal line 223 is, for example, amplified by an output amplifier (not shown), and is externally output via a pad.

The column selecting circuit 230 includes, for example, a shift register 231 and drivers 232 as many as the number of columns of the pixel array 210. Each driver 232 can include a CMOS inverter formed by a PMOS transistor 234 and NMOS transistor 233. The shift register 231 drives column selecting signals CSL1, CSL2, ... to active level in turn, so as to select a plurality of columns of the pixel array 210 in turn. When a column selecting signal used to select a column corresponding to the driver 232 goes to active level, the driver 232 enables the switch 222 of that column.

Note that the readout circuit 220 and column selecting circuit 230 in FIG. 3 are presented to exemplify their simple arrangements, and they may have various other arrangements.

Figure 4:
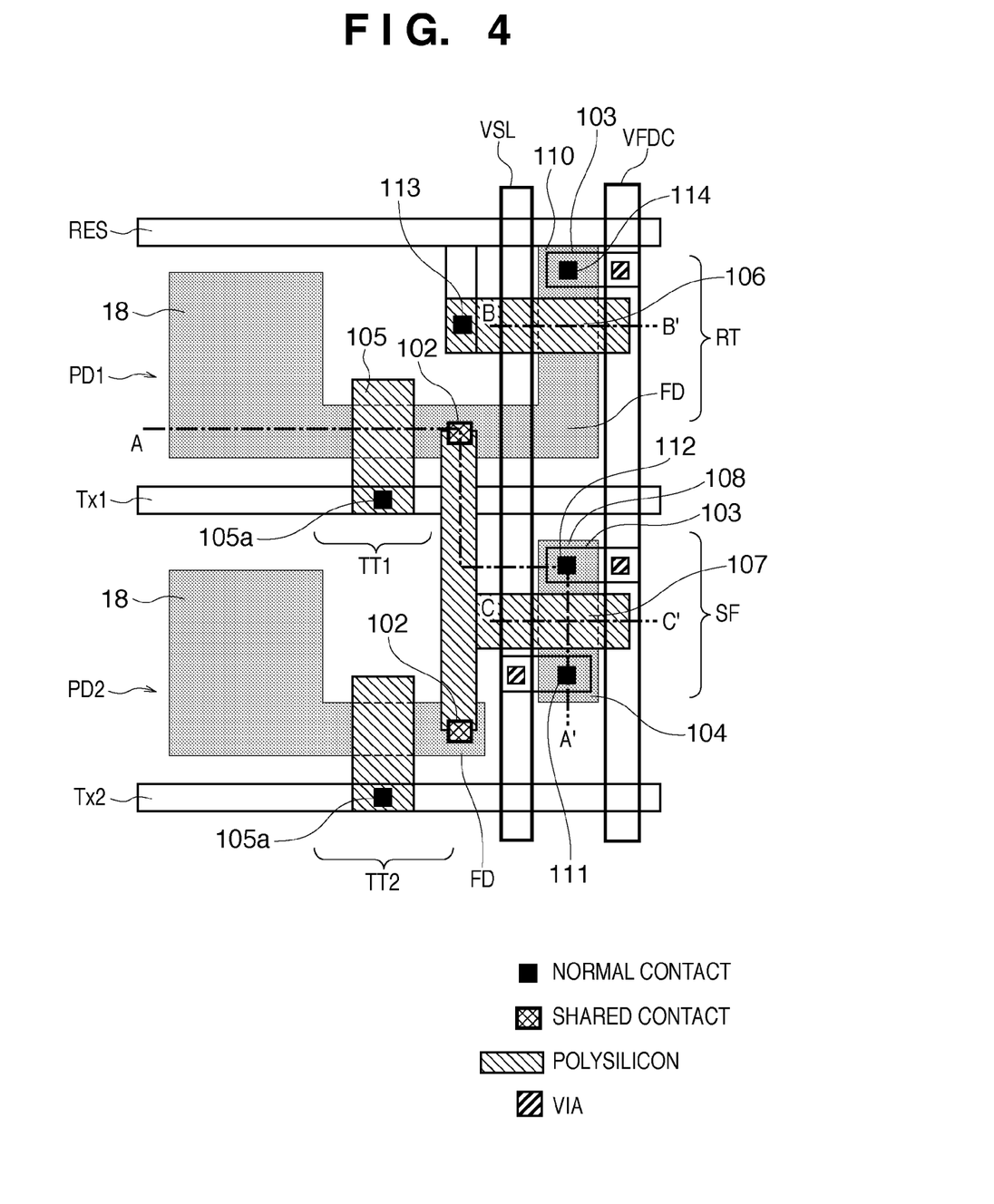
FIG. 4 is a layout view showing an example of the arrangement of the pixel unit which forms the pixel array.
Figure 5:
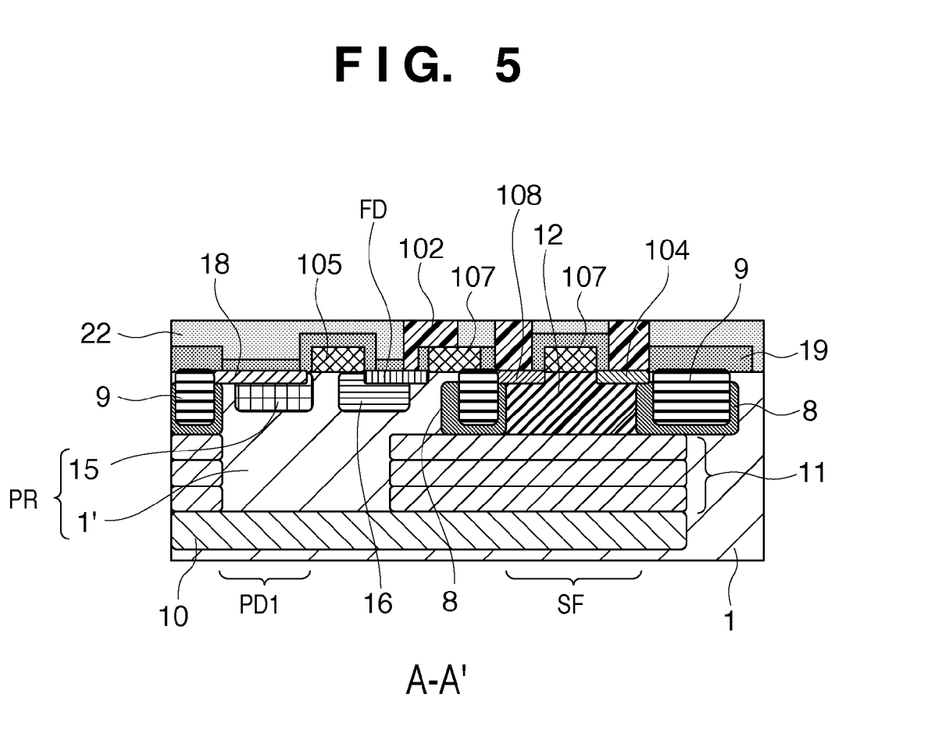
FIG. 5 is a sectional view taken along a line A-A' in FIG. 4.
Figure 6:
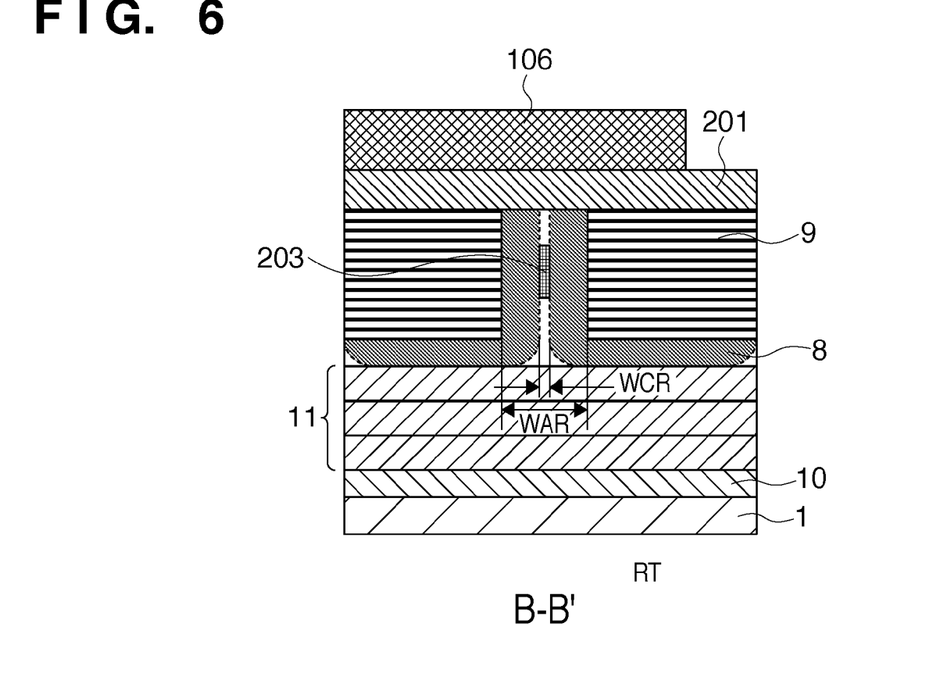
FIG. 6 is a sectional view taken along a line B-B' in FIG. 4.
Figure 7:
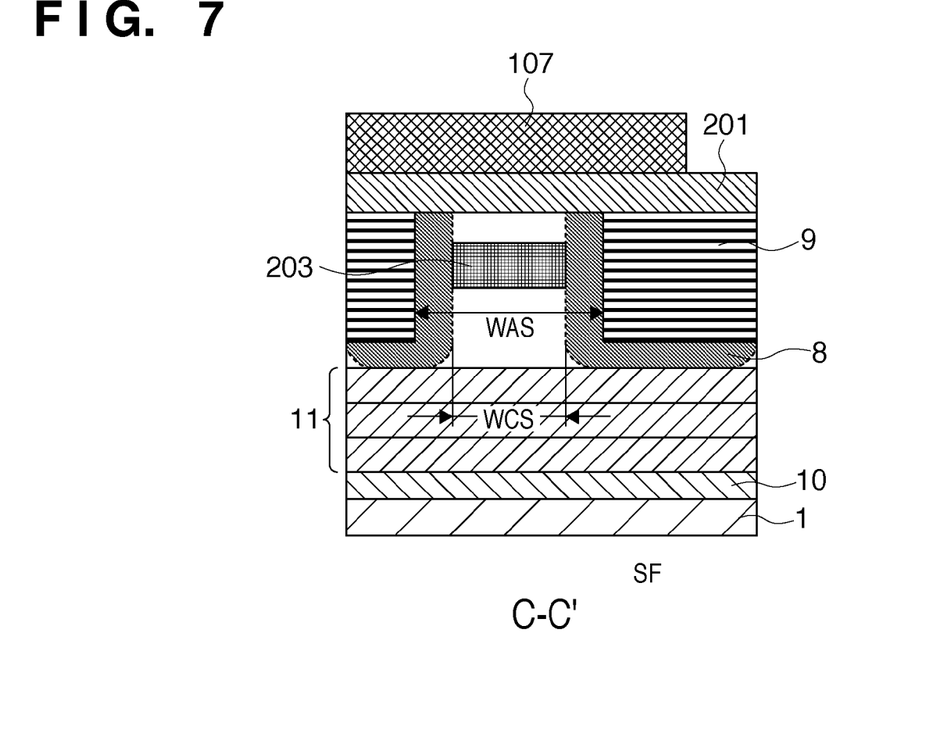
FIG. 7 is a sectional view taken along a line C-C' in FIG. 4.

FIG. 4 is a layout view showing an example of the arrangement of the pixel unit PU which forms the pixel array 210. FIG. 5 is a sectional view taken along a line A-A' in FIG. 4. FIG. 6 is a sectional view taken along a line B-B' in FIG. 4. FIG. 7 is a sectional view taken along a line C-C' in FIG. 4.

In this embodiment, the photodiode PD (PD1, PD2) is formed by a p-type region PR and an n-type buried layer 10 formed under the p-type region PR. The p-type region PR serves as the anode, and the buried layer 10 serves as the cathode. The p-type region PR includes a p-type first region 15 and a p-type second region 1', at least a portion of which is arranged between the first region 15 and the n-type buried layer 10. The first region 15 serves as a principal charge storage region. A p-type impurity concentration of the second region 1' can be the same as, for example, that of a p-type silicon substrate (semiconductor substrate) 1. A p-type impurity concentration of the first region 15 is higher than that of the second region 1'. The p-type region PR is preferably formed under an n-type surface region 18. In this case, the buried photodiode PD is formed by the n-type surface region 18, p-type region PR, and n-type buried layer 10. It is known that the buried photodiode suffers less noise generated by a dark current.

The diffusion coefficient of a dominant impurity of the n-type surface region 18 is preferably smaller than that of a dominant impurity of the buried layer 10. For example, it is preferable that the dominant impurity of the n-type surface region 18 is arsenic (As) and that of the buried layer 10 is phosphorus (P). Since the diffusion coefficient of arsenic (As) is smaller than that of phosphorus (P), forming the surface region 18 using arsenic (As) is advantageous for miniaturization since it is easy to settle its boundary. On the other hand, since it is easy to make phosphorus (P) enter to a deeper position of the semiconductor substrate than arsenic (As), forming the buried layer 10 using phosphorus (P) is to allow formation of the buried layer 10 in the deeper position, and is advantageous for sensitivity enhancement. Since the diffusion coefficient of phosphorus (P) is larger than that of arsenic (As), forming the buried layer 10 using phosphorus (P) is advantageous in formation of a broadly distributed potential barrier. Since the ion radius of phosphorus (P) is larger than the lattice constant of the silicon substrate 1, the lattices of the silicon substrate 1 are distorted by implanting phosphorus (P) into the silicon substrate 1, thus advantageously causing a gettering effect of an impurity metal element. This contributes to improvement of point defects. The buried layer 10 can be formed by ion-implanting phosphorus (P) into the semiconductor substrate 1 using a channeling phenomenon. In the present invention, impurities to be implanted or doped are not limited to arsenic (As) and phosphorus (P), and other impurities may be used.

The floating diffusion FD is a p-type third region. On a region between the p-type first region 15, which forms a portion of the photodiode PD, and the floating diffusion FD (p-type third region), a gate 105 of the transfer transistor TT (TT1, TT2) is arranged. In other words, the transfer transistor TT is formed by the p-type first region 15, floating diffusion FD (p-type third region), and gate 105. The transfer transistor TT transfers holes stored in the p-type regions (regions 15 and 1') of the photodiode PD to the floating diffusion FD. In this embodiment, the transfer transistor TT is a PMOS transistor. The gate 105 of the transfer transistor TT can be formed by polysilicon.

The p-type second region 1' can be arranged to surround the p-type first region 15 in a section. The second region 1' and floating diffusion FD (third region) are isolated by an n-type region 16, and the channel of the transfer transistor TT is formed in the n-type region 16.

Element isolation regions 9 are arranged to isolate active regions where the photodiode PD, transfer transistor TT, amplifier transistor SF, and reset transistor RT are to be formed. The active regions correspond to the surface region 18, the floating diffusion FD, and diffusion regions 104, 108, and 110 in FIG. 4, and regions other than those can be the element isolation regions 9. Formation of the element isolation regions 9 can typically use an STI (Shallow Trench Isolation) technique or LOCOS (Local Oxidation Of Silicon) technique.

Channel stop regions 8 are formed in regions that cover at least lower portions (lower side surfaces and bottom surfaces) of the element isolation regions 9. The diffusion coefficient of a dominant impurity of each channel stop region 8 is preferably smaller than that of a dominant impurity of the buried layer 10. For example, it is preferable that the dominant impurity of the channel stop region 8 is arsenic (As), and that of the buried layer 10 is phosphorus (P). As described above, since the diffusion coefficient of arsenic (As) is smaller than that of phosphorus (P), forming the channel stop regions 8 using arsenic (As) is advantageous for miniaturization. The dominant impurity of the channel stop region 8 can be the same as that of the surface region 18.

A potential barrier 11 is formed between the photodiodes PD. The potential barriers 11 can also be formed between the photodiodes PD, amplifier transistor SF, and reset transistor RT, as needed. When the element isolation regions 9 are formed to sufficiently deep positions, potential barriers between the photodiodes PD, amplifier transistor SF, and reset transistor RT are not required. In this embodiment, formation of the potential barrier 11 settles the p-type region 1' surrounded by the potential barrier 11.

A gate 107 of the amplifier transistor SF is electrically connected to the floating diffusion FD. The gate 107 of the amplifier transistor SF can be formed by polysilicon. In this embodiment, the gate 107 of the amplifier transistor SF is electrically connected to the floating diffusion FD via a contact plug 102. Note that the contact plug 102 is preferably a shared contact plug in terms of improvement of an aperture ratio or pixel density. The shared contact plug is a contact plug which electrically connects the diffusion region (source or drain) of one transistor to the gate of the other transistor via one contact plug. Note that the gate 107 of the amplifier transistor SF may be connected via one contact plug which is electrically connected to the gate 107, another contact plug which is electrically connected to the floating diffusion FD, and at least one conductive pattern.

The amplifier transistor SF is a PMOS transistor containing the gate 107 which is electrically connected to the floating diffusion FD, and the diffusion regions 104 and 108. The reset transistor RT is a PMOS transistor containing the gate 106 which is connected to the reset signal line RES, the floating diffusion FD, and the diffusion region 110. The gate of the reset transistor RT can be formed by polysilicon.

The amplifier transistor SF preferably has a buried channel structure. This is because the amplifier transistor SF having the buried channel structure can reduce 1/f noise (1/f noise is inversely proportional to the product of a channel width and channel length). On the other hand, the reset transistor RT and transfer transistor TT (and a selecting transistor used to select a row when such row selecting transistor is included) (especially, the reset transistor RT) preferably have a surface channel structure. This is because an OFF state of a transistor is important to suppress leakage of holes to the floating diffusion FD. A buried channel type transistor is readily set in a normally ON state, and is difficult to be set in an OFF state. In order to miniaturize a pixel, it is effective to miniaturize the reset transistor RT and transfer transistor TT (and a selecting transistor used to select a row when such row selecting transistor is included), and the surface channel type is advantageous for this purpose.

Preferred structures of the reset transistor RT and amplifier transistor SF will be examined below with reference to FIGS. 6 and 7. Referring to FIG. 6, reference symbol WAR denotes an interval between the element isolation regions 9 in the channel width direction of the reset transistor RT; and WCR, a channel width of the reset transistor RT. When no channel stop region 8 exists, the interval WAR and the channel width WCR match. However, due to the existence of the channel stop regions 8, the channel width WCR becomes smaller than the interval WAR. Referring to FIG. 7, reference symbol WAS denotes an interval between the element isolation regions 9 in the channel width direction of the amplifier transistor SF; and WCS, a channel width of the amplifier transistor SF. When no channel stop region 8 exists, the interval WAS and the channel width WCS match. However, due to the existence of the channel stop regions 8, the channel width WCS becomes smaller than the interval WAS. In this specification, the channel width means a dimension in consideration of the channel stop regions. Note that in FIGS. 6 and 7, reference numeral 201 denotes a gate insulating film.

In order to form the amplifier transistor SF to have the buried channel structure and the reset transistor RT to have the surface channel structure, the channel width WCS of the amplifier transistor SF is preferably larger than the channel width WCR of the reset transistor RT. An increase in channel width WCS of the amplifier transistor SF is effective for a reduction of 1/f noise. On the other hand, an increase in channel width WCR of the reset transistor RT is not preferable since it is not effective for a reduction of 1/f noise and brings about an increase in area. As a method of implementing the buried channel structure, a method of executing channel doping at a predetermined depth position from an interface between a gate insulating film and substrate is available. An impurity to be channel-doped has the same conductivity type as that of a source-drain region, and its concentration is set to be lower than the source-drain region. When the channel width is small, the width of a region to be channel-doped becomes small. Furthermore, since the conductivity type of an impurity of each channel stop region 8 is a conductivity type opposite to that of the channel-doped region, the impurity of the channel stop region 8 may be diffused into a region to be channel-doped. In such case, the impurity concentration of the channel-doped region lowers, and the buried channel structure is hardly formed.

That is, in order to realize the amplifier transistor SF having the buried channel structure and the reset transistor RT having the surface channel transistor SF, the channel width WCS of the amplifier transistor SF is preferably larger than the channel width WCR of the reset transistor RT. Note that the channel width WCS of the amplifier transistor SF is preferably larger than 1 μm, and the channel width WCR of the reset transistor RT is preferably smaller than 0.1 μm.

In this embodiment, in order to form a more stable buried channel structure of the amplifier transistor SF, the gate of the amplifier transistor SF is formed by an n-type conductive pattern. The gates of the transfer transistor TT and reset transistor RT may be formed by either a p- or n-type conductive pattern. In either case, the transfer transistor TT and reset transistor RT can have a surface channel structure. When the gates of the transfer transistor TT and reset transistor RT are formed by n-type conductive patterns, the surface channel structure can be easily obtained by decreasing the channel width, as described above, for example, by setting the channel width to be smaller than 0.1 μm.

Figure 8:
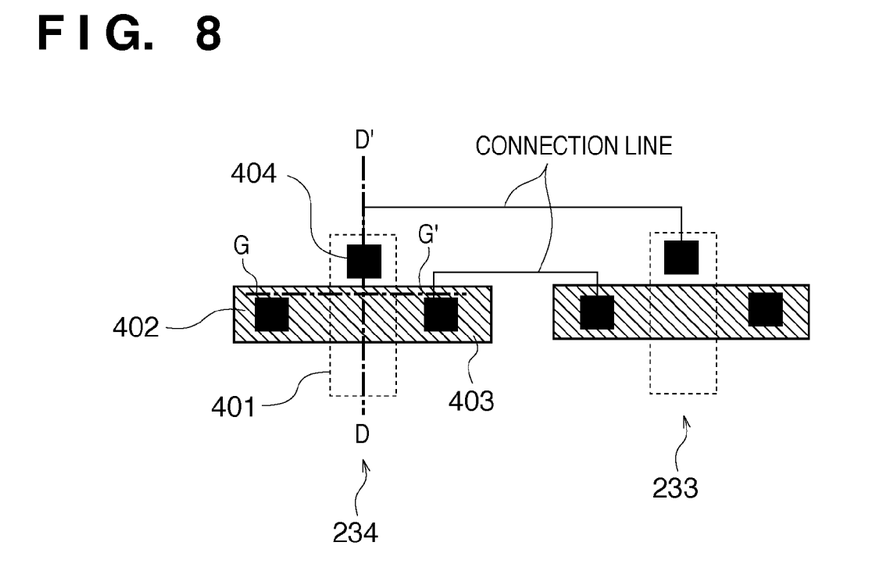
FIG. 8 is a layout view showing an example of the arrangement of a driver which forms a portion of the column selecting circuit.
Figure 9:
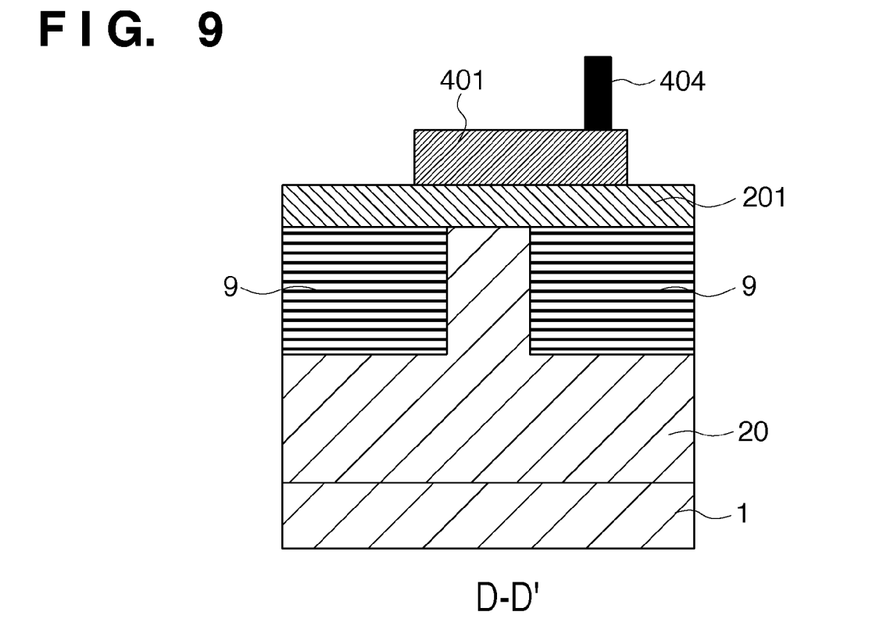
FIG. 9 is a sectional view taken along a line D-D' in a PMOS transistor shown in FIG. 8.

FIG. 8 is a layout view showing an example of the arrangement of the driver 232 which forms a portion of the column selecting circuit 230. The driver 232 can include the CMOS inverter formed by the PMOS transistor 234 and NMOS transistor 233. FIG. 9 is a sectional view taken along a line D-D' in the PMOS transistor 234 shown in FIG. 8. The PMOS transistor 234 is formed in, for example, a p-type well 20 formed in the p-type silicon substrate 1. The gate of the PMOS transistor 234 is a p-type conductive pattern. In this case, the arrangement of the driver 232 is exemplified. However, other elements which form the column selecting circuit 230 include PMOS and NMOS transistors, and each of these PMOS transistors has the same gate structure and channel structure as those of the PMOS transistor 234. Furthermore, each of PMOS transistors included in other circuits which form a peripheral circuit, for example, those included in the row selecting circuit 240 and readout circuit 220, can have the same gate structure and channel structure as those of the PMOS transistor 234.

By forming the gate of the amplifier transistor (amplifier PMOS transistor) SF in the pixel array 210 or in each pixel using the n-type conductive pattern, the amplifier transistor SF can have a buried channel structure more stably. This contributes to a reduction of 1/f noise in each pixel. On the other hand, by forming the gate of each PMOS transistor in a peripheral circuit, especially, in the column selecting circuit which requires a high-speed operation, using the p-type conductive pattern, the PMOS transistor can have a surface channel structure, thus suppressing a leak current.

Figure 10:
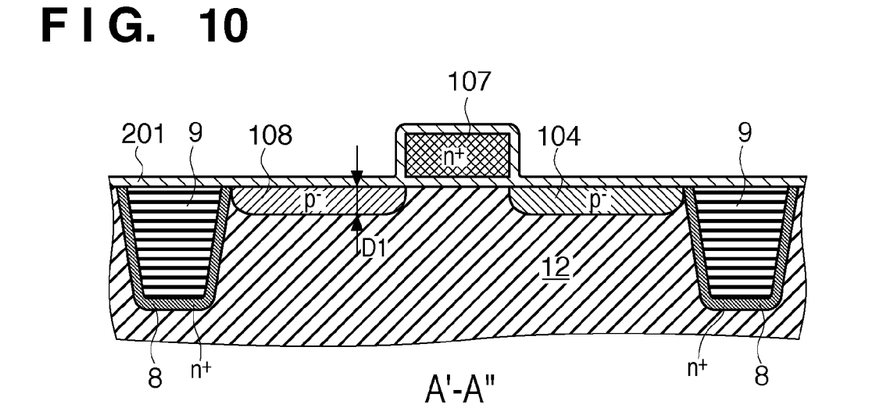
FIG. 10 is a sectional view taken along a line A'-A" in an amplifier transistor shown in FIG. 4.
Figure 11:
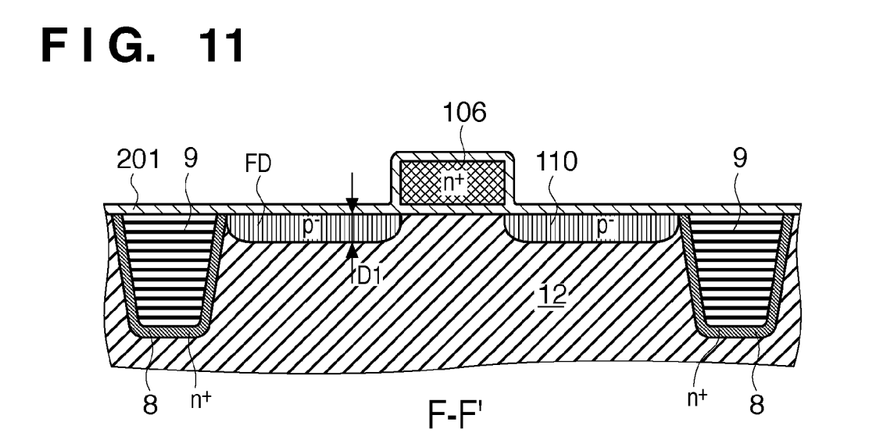
FIG. 11 is a sectional view taken along a line F-F' in a reset transistor shown in FIG. 4.
Figure 12:
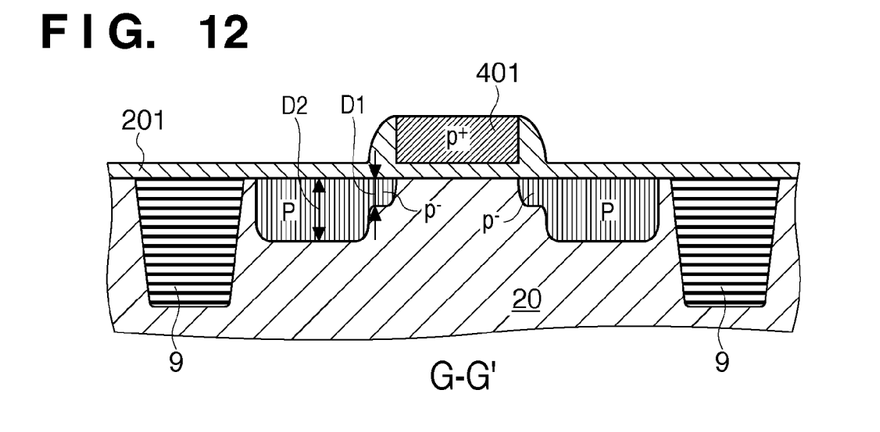
FIG. 12 is a sectional view taken along a line G-G' in a PMOS transistor of the column selecting circuit shown in FIG. 8.

The element isolation structure of each PMOS transistor in the pixel array 210 or in each pixel and each PMOS transistor in the column selecting circuit (peripheral region) 230 will be examined below. FIG. 10 is a sectional view taken along a line A'-A" in the amplifier transistor SF shown in FIG. 4. FIG. 11 is a sectional view taken along a line F-F' in the reset transistor RT shown in FIG. 4. FIG. 12 is a sectional view taken along a line G-G' in the PMOS transistor of the column selecting circuit 230 shown in FIG. 8. As exemplified in FIGS. 10, 11, and 12, the element isolation region in the pixel array 210 or in each pixel, and that in the peripheral circuit are preferably STI regions in terms of circuit integration.

As exemplified in FIG. 10, the gate 107 of the amplifier transistor (amplifier PMOS transistor) SF in each pixel unit PU or pixel is formed by an n-type conductive pattern. The amplifier transistor (amplifier PMOS transistor) SF is isolated by the element isolation region (first element isolation region) 9 and channel stop region (n-type impurity region) 8 which covers at least the lower portion of the element isolation region 9. As exemplified in FIG. 11, the gate 106 of the reset transistor (reset PMOS transistor) RT in each pixel unit PU or pixel is preferably formed by an n-type conductive pattern. The reset transistor (reset PMOS transistor) RT is preferably isolated by the element isolation region (first element isolation region) 9 and channel stop region (n-type impurity region) 8 which covers at least the lower portion of the element isolation region 9. Also, the transfer transistor TT preferably has a gate formed by an n-type conductive pattern, and is preferably isolated by the element isolation region 9 and the channel stop region (n-type impurity region) 8 which covers at least the lower portion of the element isolation region 9. The dominant impurity of the channel stop region 8 is preferably arsenic (As), as described above.

As described above, by isolating the PMOS transistors in each pixel unit PU or pixel, especially, the amplifier transistor SF by the element isolation region 9 and channel stop region 8 which covers at least the lower portion of the element isolation region 9, the influence of a dark current can be suppressed.

On the other hand, a gate 401 of the PMOS transistor 234 included in the column selecting circuit 230 is formed by a p-type conductive pattern. The PMOS transistor 234 included in the column selecting circuit 230 is isolated by the element isolation region (second element isolation region) 9 without any channel stop region 8. In other words, the n-type impurity concentration in a region adjacent to the lower portion of the element isolation region 9 used to isolate the PMOS transistor 234 is lower than that in the channel stop region 8 which covers at least the lower portion of the element isolation region 9 used to isolate the amplifier transistor SF.

As described above, since each PMOS transistor in the peripheral circuit, especially, in the column selecting circuit 230 which requires a high-speed operation, is isolated by the element isolation region 9 without any channel stop region 8, the ON resistance of that PMOS transistor can be lowered.

According to this embodiment, since the channel structures and isolation structures of the PMOS transistors in each pixel and in the peripheral circuit are optimized, both a reduction of 1/f noise in each pixel and a high readout speed of a signal in the image sensing device can be attained.

The source and drain of the amplifier transistor SF are preferably entirely formed by regions of a low-impurity concentration. On the other hand, the source and drain of each PMOS transistor of the column selecting circuit 230 preferably have an LDD (Lightly Doped Drain) structure. Assume that a maximum depth of the source and drain of the amplifier transistor SF is a first depth D1. The LDD structure of the source and drain of each PMOS transistor of the column selecting circuit 230 includes a portion having the first depth D1 and a portion having a second depth D2 deeper than the first depth D1.

Figure 14:
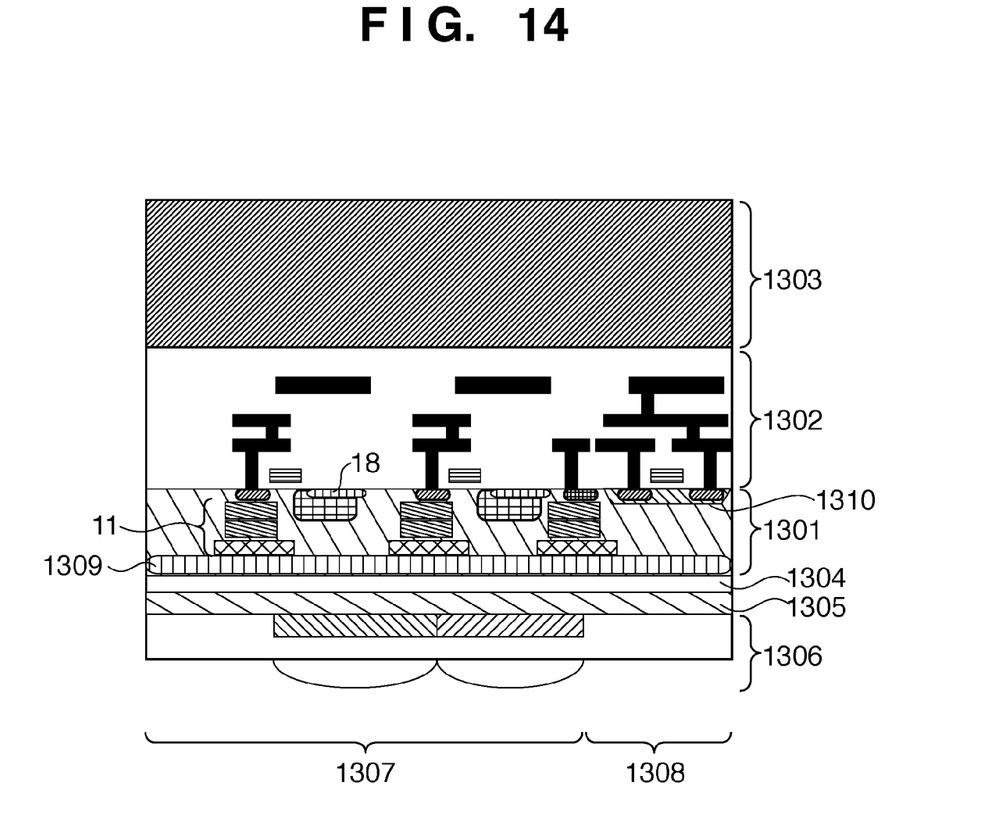
FIG. 14 is a view for explaining an example of a method of manufacturing an image sensing device according to another embodiment of the present invention.

FIG. 14 shows the sectional structure of an image sensing device (or photoelectric conversion device) according to another embodiment of the present invention. FIG. 14 illustrates one transistor portion which forms a photodiode, floating diffusion, and peripheral circuit. The same reference numerals denote portions having the same functions as in the structure of the aforementioned embodiment, and a detailed description thereof will not be repeated. A difference of the embodiment shown in FIG. 14 from the aforementioned embodiment lies in a direction of incidence of light. In the embodiment shown in FIG. 14, a back-side illumination structure which receives light from the lower direction in FIG. 14 (i.e., a side opposite to a side where interconnection layers are formed) is adopted.

A photoelectric conversion unit, semiconductor regions of transistors, and the like are formed on a semiconductor substrate 1301. An interconnection layer 1302 is arranged on the first principal surface side (obverse surface side) of the semiconductor substrate 1301. A support substrate 1303 is arranged on the upper portion of the interconnection layer 1302, that is, on the side opposite to the substrate 1301 when viewed from the interconnection layer 1302, for the purpose of mainly assuring a high mechanical strength of the image sensing device. An optical function unit 1306 is arranged as needed via an oxide film 1304 and protective film 1305 on the second principal surface side (back surface side) of the semiconductor substrate 1301, that is, on the side opposite to the interconnection layer 1302 when viewed from the semiconductor substrate 1301. The optical function unit 1306 can include, for example, color filters, microlenses, and a planarized layer. In this manner, the image sensing device according to the embodiment shown in FIG. 14 has the back-side illumination structure which receives light from the side opposite to the formation side of the interconnection layer, that is, the back side.

FIG. 14 illustrates a pixel region 1307 and peripheral circuit region 1308. The pixel region 1307 is a region corresponding to a pixel array 210. On the pixel region 1307, a plurality of photoelectric conversion units are arranged. On the peripheral circuit region 1308, a well 1310 for a peripheral circuit transistor is arranged. The peripheral circuit region 1308 includes a readout circuit 220, column selecting circuit 230, and row selecting circuit 240.

On an interface of the second principal surface side (back surface side) of the semiconductor substrate 1301, an n$^+$-type semiconductor region 1309 is arranged. The n$^+$-type semiconductor region 1309 is a region corresponding to a buried layer 10. The n$^+$-type semiconductor region 1309 can also serve as a layer used to suppress a dark current at an interface of the oxide film 1304. That is, in case of the back-side illumination type, a dark current suppression layer is formed on the first and second principal surfaces. In FIG. 14, the n$^+$-type semiconductor region 1309 is arranged on the entire surface of the semiconductor substrate 1301, but it may be arranged only on the pixel region 1308.

The diffusion coefficient of a dominant impurity of an n-type surface region 18 is preferably smaller than that of a dominant impurity of the n$^+$-type semiconductor region 1309 as the buried layer. For example, the dominant impurity of the n-type surface region 18 is preferably arsenic (As), and that of the n$^+$-type semiconductor region 1309 is preferably phosphorus (P). Since the diffusion coefficient of arsenic (As) is smaller than that of phosphorus (P), forming the surface region 18 using arsenic (As) is advantageous for miniaturization since it is easy to settle its boundary. On the other hand, since it is easy to make phosphorus (P) enter to a deeper position of the semiconductor substrate than arsenic (As), forming the n$^+$-type semiconductor layer 1309 using phosphorus (P) is to allow to form the n$^+$-type semiconductor layer 1309 in the deeper position, and is advantageous for sensitivity enhancement. Since the diffusion coefficient of phosphorus (P) is larger than that of arsenic (As), forming the n$^+$-type semiconductor layer 1309 using phosphorus (P) is advantageous in formation of a broadly distributed potential barrier. Since the ion radius of phosphorus (P) is larger than the lattice constant of the semiconductor substrate 1301, the lattices of the semiconductor substrate 1301 are distorted by implanting phosphorus (P) into the semiconductor substrate 1301, thus advantageously causing a gettering effect of an impurity metal element. This contributes to improvement of point defects. The n$^+$-type semiconductor layer 1309 can be formed by ion-implanting phosphorus (P) into the semiconductor substrate 1301 using a channeling phenomenon. In the present invention, impurities to be implanted or doped are not limited to arsenic (As) and phosphorus (P), and other impurities may be used.

Figure 13:
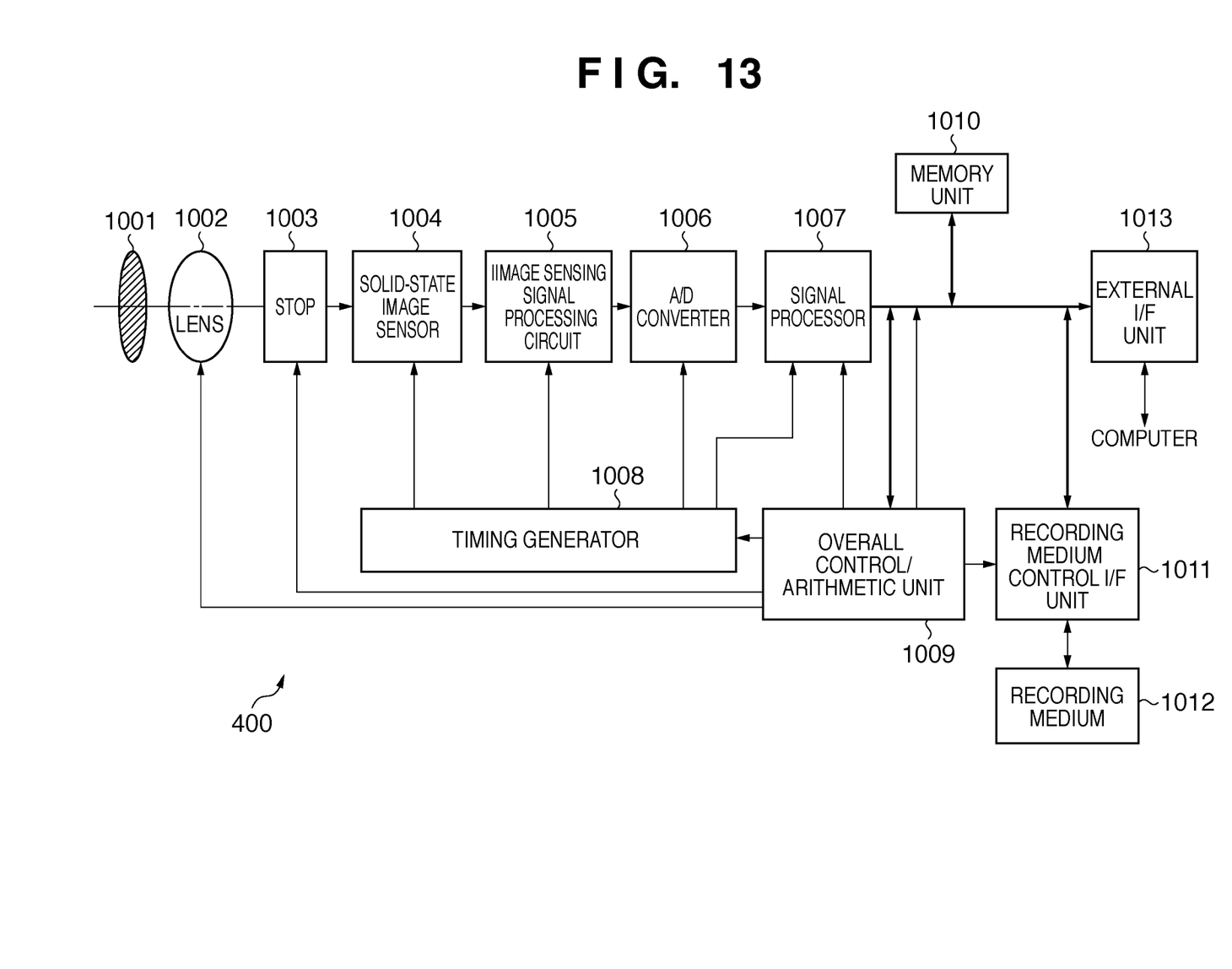
FIG. 13 is a schematic block diagram showing the arrangement of a camera according to an embodiment of the present invention.

FIG. 13 is a schematic block diagram showing the arrangement of a camera according to an embodiment of the present invention. Note that the concept of a camera includes not only an apparatus primarily intended to photographing but also an apparatus which secondarily includes a photographing function (for example, a personal computer or portable terminal). A camera 400 includes a solid-state image sensor 1004 represented by the aforementioned image sensing device 200. An optical image of an object is formed on an image sensing surface of the solid-state image sensor 1004 via a lens 1002. On the outer side of the lens 1002, a barrier 1001 which serves as a protection function of the lens 1002 and a main switch is arranged. A stop 1003 used to adjust the amount of light that emerges from the lens 1002 may be arranged for the lens 1002. An image sensing signal output from the solid-state image sensor 1004 undergoes processing such as various kinds of correction and clamping by an image sensing signal processing circuit 1005. The image sensing signal output from the image sensing signal processing circuit 1005 is analog-to-digital converted by an A/D converter 1006. Image data output from the A/D converter 1006 undergoes signal processing such as correction and data compression by a signal processor 1007. The solid-state image sensor 1004, image sensing signal processing circuit 1005, A/D converter 1006, and signal processor 1007 operate according to timing signals generated by a timing generator 1008.

The blocks 1005 to 1008 may be formed on the same chip as the solid-state image sensor 1004. The respective blocks of the camera 400 are controlled by an overall control/arithmetic unit 1009. The camera 400 also includes a memory unit 1010 used to temporarily store image data, and a recording medium control interface unit 1011 used to record or read out an image in or from a recording medium. A recording medium 1012 includes, for example, a semiconductor memory, and is detachable. The camera 400 may include an external interface (I/F) unit 1013 required to communicate with, for example, an external computer.

The operation of the camera 400 shown in FIG. 13 will be described below. In response to an opening action of the barrier 1001, a main power supply, a power supply of a control system, and that of image sensing system circuits including the A/D converter 1006 are turned on in turn. The overall control/arithmetic unit 1009 sets the stop 1003 to have a full aperture value in order to control an exposure amount.

A signal output from the solid-state image sensor 1004 is supplied to the A/D converter 1006 through the image sensing signal processing circuit 1005. The A/D converter 1006 A/D-converts that signal, and outputs digital data to the signal processor 1007. The signal processor 1007 processes that data and provides the processed data to the overall control/arithmetic unit 1009, which executes arithmetic operations required to decide an exposure amount. The overall control/arithmetic unit 1009 controls the stop based on the decided exposure amount.

Next, the overall control/arithmetic unit 1009 extracts high-frequency components from the signal, which is output from the solid-state image sensor 1004 and is processed by the signal processor 1007, and calculates a distance to the object based on the high-frequency components. After that, the overall control/arithmetic unit 1009 drives the lens 1002 to check whether or not an in-focus state is attained. If it is determined that an in-focus state is not attained, the overall control/arithmetic unit 1009 drives the lens 1002 again to calculate a distance.

After an in-focus state is confirmed, main exposure is started. Upon completion of exposure, an image sensing signal output from the solid-state image sensor 1004 undergoes correction and the like in the image sensing signal processing circuit 1005, is A/D-converted by the A/D converter 1006, and is processed by the signal processor 1007. Image data processed by the signal processor 1007 is stored in the memory unit 1010 by the overall control/arithmetic unit 1009.

After that, the image data stored in the memory unit 1010 is recorded in the recording medium 1012 via the recording medium control I/F under the control of the overall control/arithmetic unit 1009. Also, the image data can be provided to and processed by a computer via the external I/F unit 1013.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-026699, filed Feb. 6, 2009 and No. 2009-293211 filed Dec. 24, 2009, which are hereby incorporated by reference herein in their entirety.

The invention claimed is:

1. An image sensing device comprising:
a pixel array in which pixels are arranged to form a plurality of rows and a plurality of columns; and
a peripheral circuit including a row selecting circuit which selects a row in the pixel array, a column selecting circuit which selects a column in the pixel array, and a readout circuit which reads out a signal of the column selected by the column selecting circuit in the pixel array,
wherein each pixel includes a photodiode, a floating diffusion, a transfer PMOS transistor which transfers a hole stored in a storage region of the photodiode to the floating diffusion, an amplifier PMOS transistor which amplifies a signal that appears in the floating diffusion, and a reset PMOS transistor which resets a potential of the floating diffusion,
the amplifier PMOS transistor has a gate which is formed by an n-type conductive pattern, and is isolated by a first element isolation region and an n-type impurity region which covers at least a lower portion of the first element isolation region, and
each PMOS transistor included in the column selecting circuit has a gate which is formed by a p-type conductive pattern and is isolated by a second element isolation region, and an n-type impurity concentration in a region adjacent to a lower portion of the second element isolation region is lower than an n-type impurity concentration in the n-type impurity region.

2. The device according to claim 1, wherein an element isolation region in the pixel array and an element isolation region in the peripheral circuit are STI (Shallow Trench Isolation) regions.

3. The device according to claim 1, wherein an n-type impurity of the n-type impurity region is arsenic.

4. The device according to claim 1, wherein the gate of the transfer PMOS transistor and the gate of the reset PMOS transistor are formed by a p-type conductive pattern.

5. The device according to claim 4, wherein the amplifier PMOS transistor has a buried channel structure, and the transfer PMOS transistor and the reset PMOS transistor have a surface channel structure.

6. The device according to claim 1, wherein
a maximum depth of a source and a drain of the amplifier PMOS transistor is a first depth, and
a source and a drain of the PMOS transistor included in the column selecting circuit have an LDD (Lightly Doped Drain) structure including a portion having the first depth, and a portion having a second depth deeper than the first depth.

7. The image sensing device according to claim 1, wherein the photoelectric conversion device is configured as a back-side illumination type photoelectric conversion device.

8. The image sensing device according to claim 1, wherein a channel width of the amplifier PMOS transistor is larger than a channel width of the reset PMOS transistor.

9. A camera comprising:
an image sensing device according to claim 1; and
a signal processor which processes a signal obtained by the photoelectric conversion device.

* * * * *